United States Patent
Nagasaki et al.

(10) Patent No.: US 11,848,245 B2
(45) Date of Patent: Dec. 19, 2023

(54) POWER SEMICONDUCTOR APPARATUS (71) Applicant: HITACHI AUTOMOTIVE SYSTEMS, LTD., Hitachinaka (JP)

(72) Inventors: Hironori Nagasaki, Tokyo (JP); Shintaro Tanaka, Tokyo (JP); Takashi Hirao, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 411 days.

(21) Appl. No.: 17/262,916

(22) PCT Filed: Jul. 11, 2019

(86) PCT No.: PCT/JP2019/027447
§ 371 (c)(1),
(2) Date: Jan. 25, 2021

(87) PCT Pub. No.: WO2020/022074
PCT Pub. Date: Jan. 30, 2020

(65) Prior Publication Data
US 2021/0280483 A1  Sep. 9, 2021

(30) Foreign Application Priority Data
Jul. 27, 2018 (JP) .................. 2018-140858

(51) Int. Cl.
*H01L 23/492* (2006.01)
*H01L 23/495* (2006.01)
(Continued)

(52) U.S. Cl.
CPC ...... *H01L 23/3121* (2013.01); *H01L 23/4924* (2013.01); *H01L 23/49541* (2013.01);
(Continued)

(58) Field of Classification Search
None
See application file for complete search history.

(56) References Cited

U.S. PATENT DOCUMENTS

2015/0364393 A1* 12/2015 Otake ............... H01L 23/49562
257/704

FOREIGN PATENT DOCUMENTS

JP  2013-038848 A  2/2013
JP  2013038848 A * 2/2013
(Continued)

OTHER PUBLICATIONS

International Search Report with English translation and Written Opinion issued in corresponding application No. PCT/JP2019/027447 dated Oct. 15, 2019.

*Primary Examiner* — Michelle Mandala
*Assistant Examiner* — Jordan M Klein
(74) *Attorney, Agent, or Firm* — Foley & Lardner LLP (57) ABSTRACT

A power semiconductor apparatus includes a power semiconductor element having low and high potential side electrodes and a sense electrode, high and low potential side conductors electrically connected with the high potential side electrodes, respectively, a sense wiring electrically connected with the sense electrode, and a first metal portion facing the low potential side conductor or the low potential side conductor across the sense wiring. When viewed from an array direction of the sense wiring and the first metal portion, the sense wiring has a facing portion facing the high or low potential side conductor, the first metal portion forms a recess in a part overlapping the facing portion, and a depth of the recess is formed such that a distance between a bottom of the recess and the sense wiring is larger than a distance between the sense wiring and the high or low potential side conductor.

6 Claims, 9 Drawing Sheets

(51) Int. Cl.
*H01L 23/00* (2006.01)
*H01L 25/18* (2023.01)
*H02M 7/00* (2006.01)
*H01L 23/367* (2006.01)
*H01L 23/31* (2006.01)

(52) U.S. Cl.
CPC .............. *H01L 24/32* (2013.01); *H01L 25/18* (2013.01); *H02M 7/003* (2013.01); *H01L 23/367* (2013.01)

(56)  References Cited

FOREIGN PATENT DOCUMENTS

| | | | | |
|---|---|---|---|---|
| JP | 2014-229642 A | | 12/2014 | |
| JP | 2014229642 A | * | 12/2014 | |
| JP | 2016-036194 A | | 3/2016 | |
| JP | 2016036194 A | * | 3/2016 | .............. H02M 7/48 |
| JP | 2018-061066 A | | 4/2018 | |

* cited by examiner

POWER SEMICONDUCTOR APPARATUS

TECHNICAL FIELD

The present invention relates to a power semiconductor apparatus, in particular, to a power semiconductor apparatus that controls an in-vehicle drive motor.

BACKGROUND ART

In recent years, a power conversion apparatus equipped with a power semiconductor apparatus is required to have a short-circuit protection function and high heat dissipation. PTL 1 discloses a means for ensuring a protection operation by a magnetic coupling between a main circuit terminal and a control terminal even when di/dt at the rise or fall of a short-circuit current is large. PTL 2 discloses a structure in which heat dissipation properties are improved by covering a power semiconductor element with an external metal.

However, it is required to further improve the reliability of the power semiconductor apparatus when short-circuit protection is activated.

CITATION LIST

Patent Literature

PTL 1: JP 2014-229642 A
PTL 2: JP 2016-36194 A

SUMMARY OF INVENTION

Technical Problem

An object of the present invention is to suppress an overvoltage at the time of occurrence of an overcurrent without impairing heat dissipation properties of a power semiconductor apparatus, and to improve reliability.

Solution to Problem

A power semiconductor apparatus according to the present invention includes: a power semiconductor element having a low potential side electrode, a high potential side electrode, and a sense electrode; a low potential side conductor electrically connected with the low potential side electrode; a sense wiring electrically connected with the sense electrode; and a first metal portion facing the low potential side conductor across the sense wiring, wherein when viewed from an array direction of the sense wiring and the first metal portion, the sense wiring has a facing portion facing the low potential side conductor, the first metal portion forms a recess in a part overlapping the facing portion, and a depth of the recess is formed such that a distance between a bottom of the recess and the sense wiring is larger than a distance between the sense wiring and the low potential side conductor.

Thus, a main circuit and a control terminal inside the power semiconductor are magnetically coupled by providing a recess in a heat dissipation base that is an external metal causing magnetic coupling to be suppressed, and the voltage of the control terminal is slowly turned off when short-circuit protection is activated, thereby suppressing an overvoltage causing deterioration of the semiconductor element.

Advantageous Effects of Invention

According to the present invention, an overvoltage at the time of overcurrent generation can be suppressed without impairing heat dissipation properties of a power semiconductor module.

DESCRIPTION OF EMBODIMENTS

Embodiments of the power semiconductor apparatus according to the present invention will be described below with reference to the drawings. In each figure, identical elements are given the identical reference numerals, and redundant description is omitted. The present invention is not limited to the following embodiments, and includes, in its scope, various modifications and applications within the technical concept of the present invention.

Figure 1:
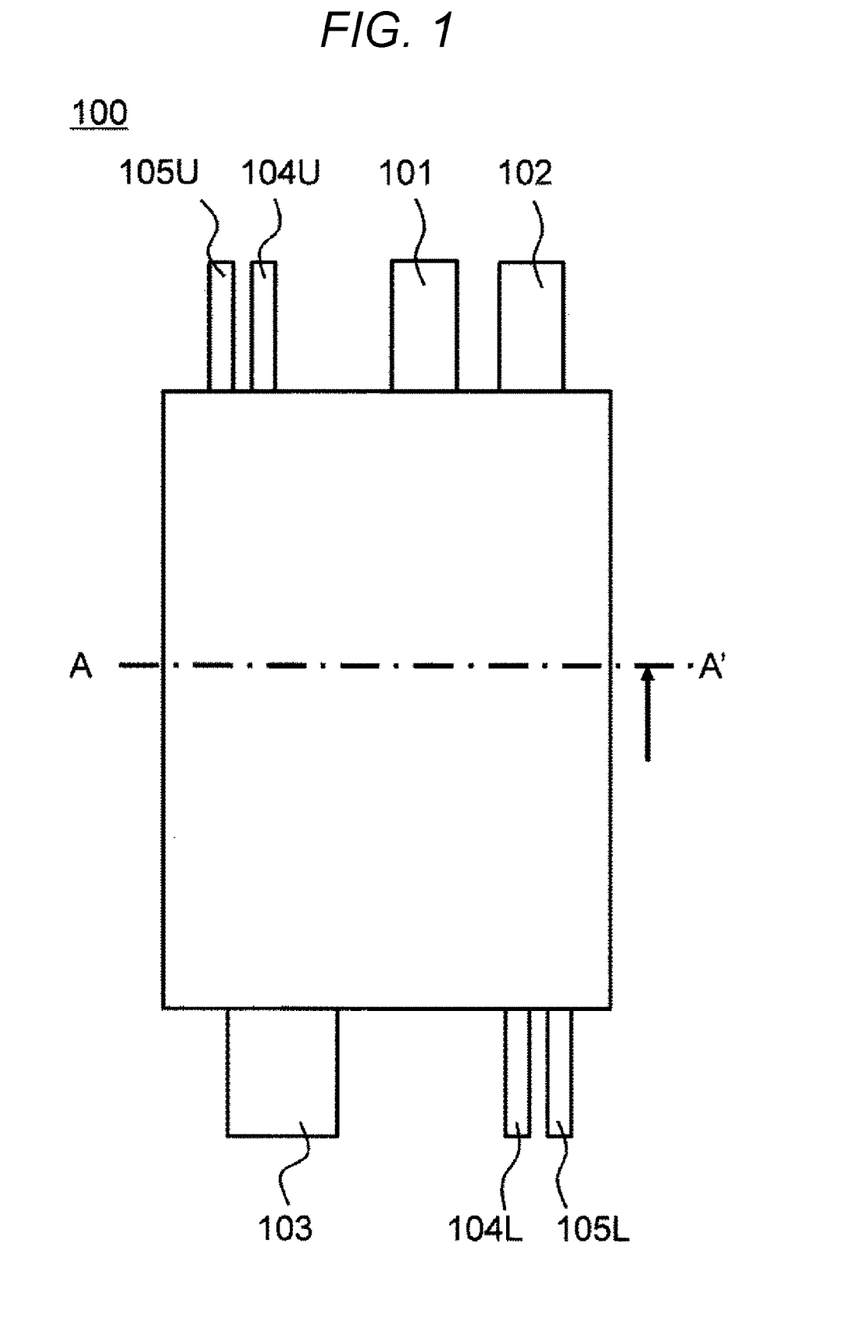
FIG. 1 is an external front view of a power semiconductor apparatus 100 according to the present embodiment.

FIG. 1 is an external front view of the power semiconductor apparatus 100 according to the present embodiment.

Figure 2:
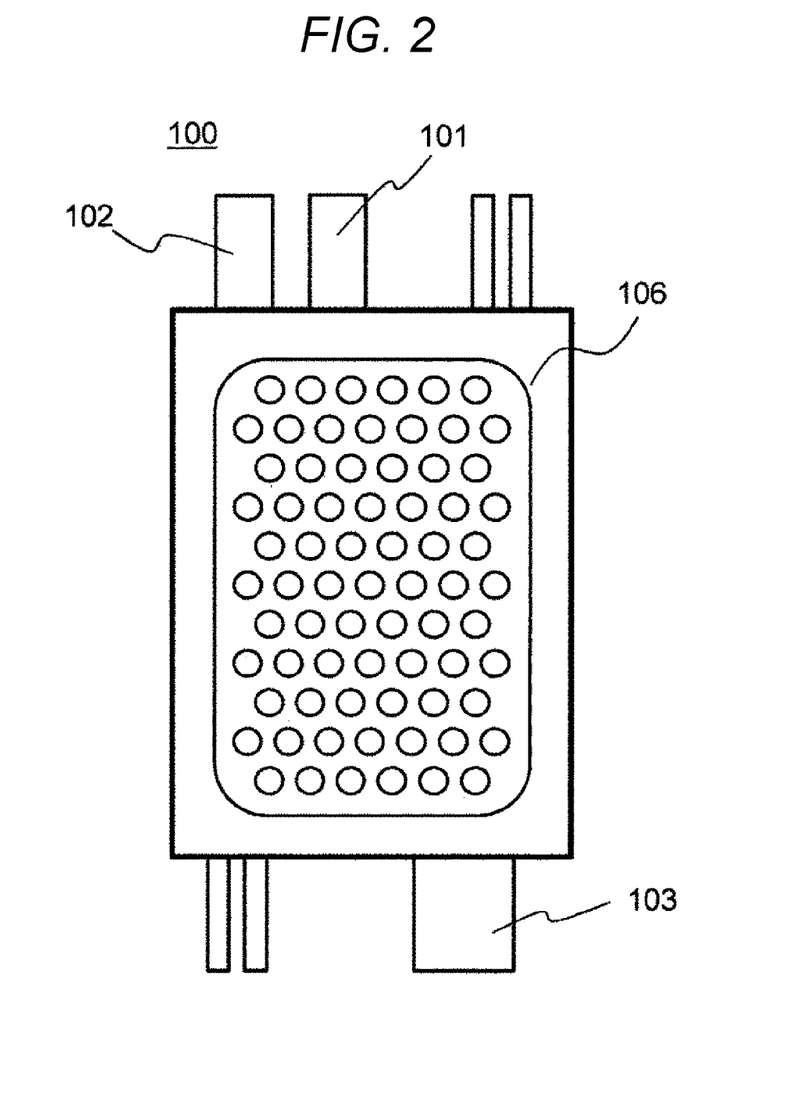
FIG. 2 is an external front view of the power semiconductor apparatus 100 according to the present embodiment when viewed in a direction opposite to that of FIG. 1.
Figure 3:
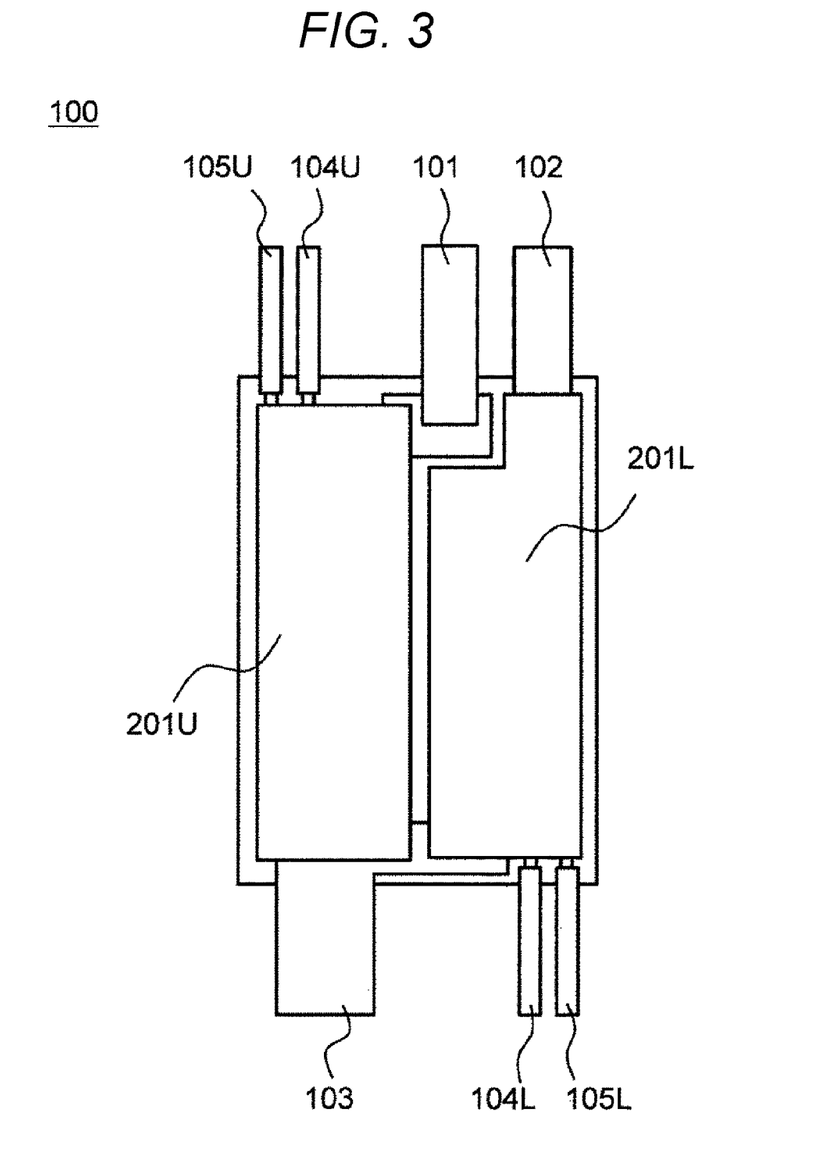
FIG. 3 is an internal structural view of the power semiconductor apparatus 100 shown in FIG. 1, from which a molding material 405 is removed.
Figure 4:
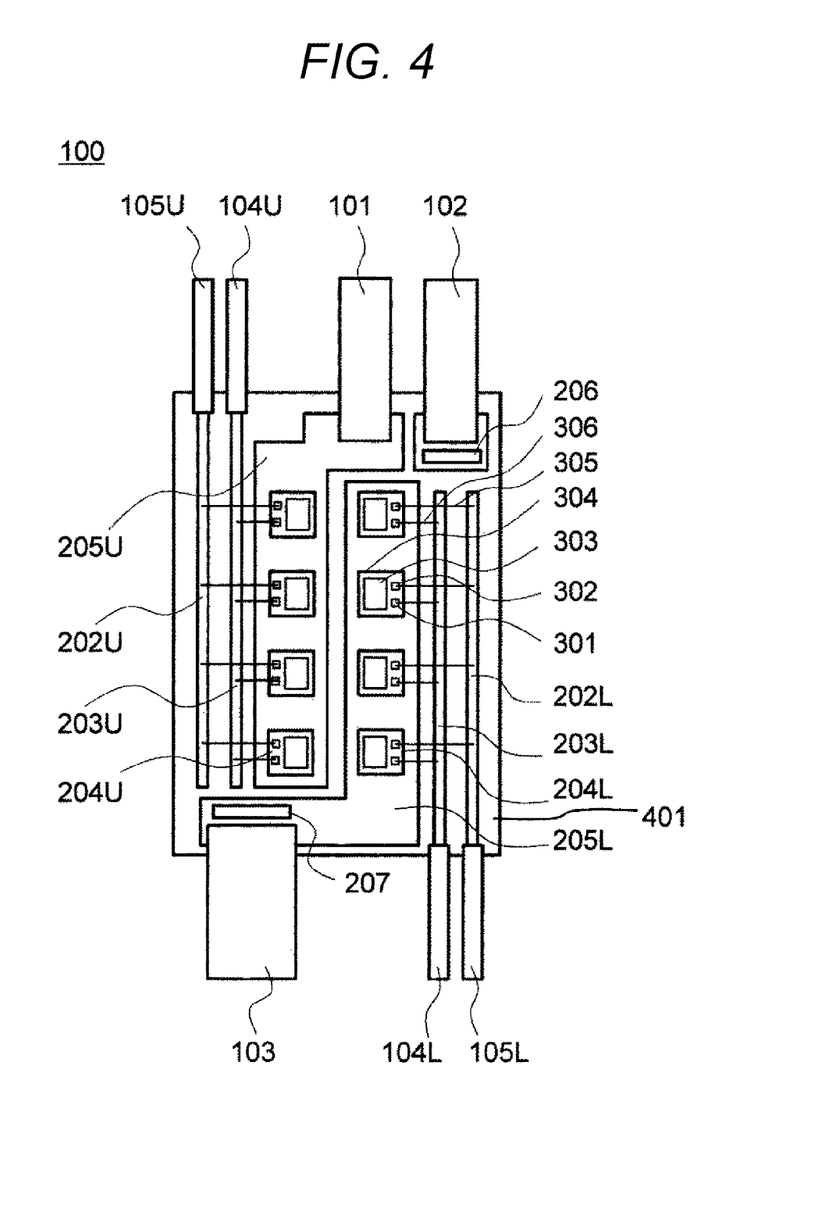
FIG. 4 is an internal structural view of the power semiconductor apparatus 100 shown in FIG. 3, from which low potential side conductors 201U and 201L are removed.
Figure 5:
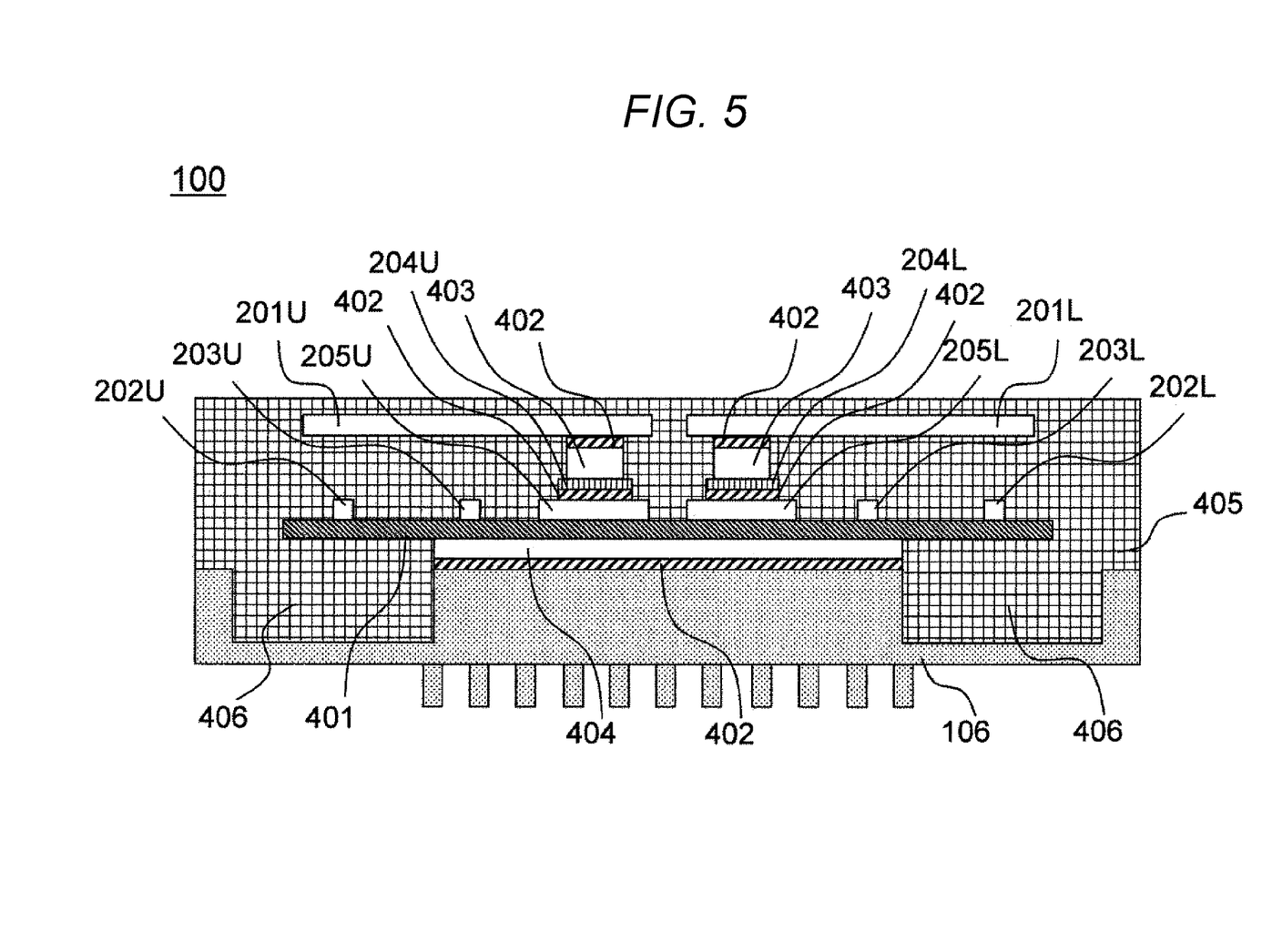
FIG. 5 is a cross-sectional view of the power semiconductor apparatus 100 when a cross section A-A' shown in FIG. 1 is viewed from the direction of the arrow.
Figure 6:
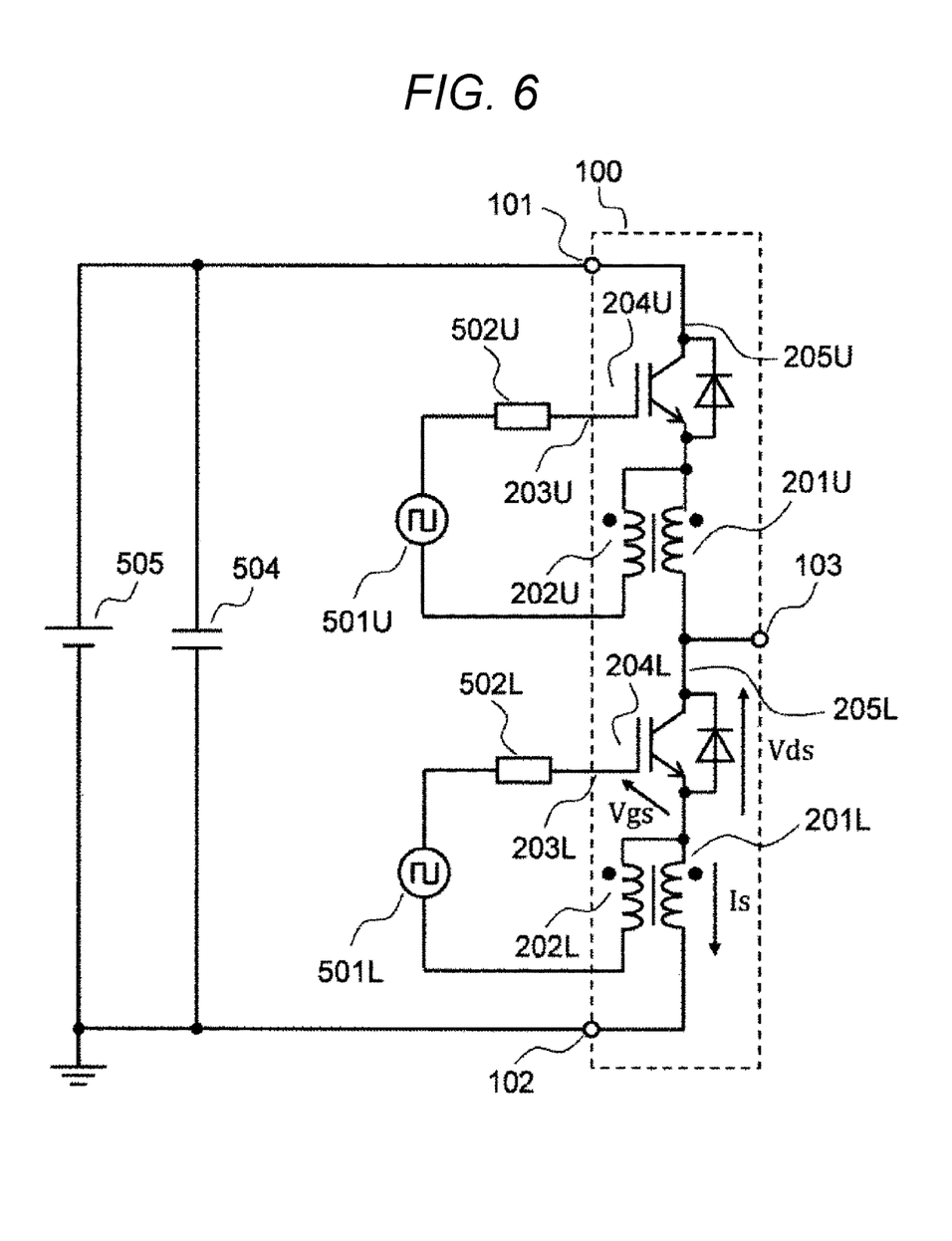
FIG. 6 is a circuit diagram showing a configuration of a drive circuit corresponding to the power semiconductor apparatus 100 according to the present embodiment.

FIG. 2 is an external front view of the power semiconductor apparatus 100 according to the present embodiment when viewed in the direction opposite to that of FIG. 1. FIG. 3 is an internal structural view of the power semiconductor apparatus 100 shown in FIG. 1, from which the molding material 405 is removed. FIG. 4 is an internal structural view of the power semiconductor apparatus 100 shown in FIG. 3, from which the low potential side conductors 201U and 201L are removed. FIG. 5 is a cross-sectional view of the power semiconductor apparatus 100 when the cross section A-A' shown in FIG. 1 is viewed from the direction of the arrow. FIG. 6 is a circuit diagram showing the configuration of a drive circuit corresponding to the power semiconductor apparatus 100 according to the present embodiment.

As a power semiconductor element 204 shown in FIG. 4, for example, a MOSFET or an IGBT can be used. The power semiconductor element 204 includes a power semiconductor element 204U on the upper arm side constituting an upper arm of an inverter circuit and a power semiconductor element 204L on the lower arm side constituting a lower arm of the inverter circuit.

As shown in FIGS. 4 and 6, an alternate-current output terminal 103 is connected with a high potential side conductor 205L connected with an emitter electrode side of the power semiconductor element 204L on the lower arm side. An intermediate electrode 207 connects the low potential side conductor 201U and the high potential side conductor 205L shown in FIGS. 3 and 6. An intermediate electrode 206 connects the low potential side conductor 201L and the high potential side conductor 205L shown in FIGS. 3 and 6.

The high potential side conductor 205U constitutes a conductor of a high potential side on the upper arm side of the inverter circuit of FIG. 6.

The power semiconductor elements 204U and 204L shown in FIG. 4 each include a positive electrode sense electrode 301, a negative electrode sense electrode 302, a low potential side electrode 303, and a high potential side electrode 304 (back side of the power semiconductor element 204L). In a case where those electrodes are IGBTs, the positive electrode sense electrode 301 corresponds to a gate electrode, the negative electrode sense electrode 302 corresponds to a Kelvin emitter electrode, the low potential side electrode 303 corresponds to an emitter electrode, and the high potential side electrode 304 corresponds to a collector electrode. In a case where those electrodes are MOSFETs, the positive electrode sense electrode 301 corresponds to a gate electrode, the negative electrode sense electrode 302 corresponds to a Kelvin source electrode, the low potential side electrode 303 corresponds to a source electrode, and the high potential side electrode 304 corresponds to a drain electrode.

A positive electrode sense wiring 203L is mounted on an insulation layer 401. The positive electrode sense wiring 203L is connected with a positive electrode sense terminal 104L via a solder material. The positive electrode sense electrode 301 is electrically connected with the positive electrode sense wiring 203L via wire bonding 305.

A negative electrode sense wiring 202L is mounted on the insulation layer 401. The negative electrode sense wiring 202L is connected with a negative electrode sense terminal 105L via a solder material. The negative electrode sense electrode 302 is electrically connected with the negative electrode sense wiring 202L via wire bonding 306.

Similarly, the positive electrode sense wiring 203U is mounted on the insulation layer 401. The positive electrode sense wiring 203U is connected with a positive electrode sense terminal 104U via a solder material.

A negative electrode sense wiring 202U is mounted on the insulation layer 401. The negative electrode sense wiring 202U is connected with a negative electrode sense terminal 105U via a solder material.

As shown in FIG. 5, the low potential side electrode 303 is electrically connected with a spacer 403 via a solder material 402. The spacer 403 is electrically connected with the low potential side conductor 201L via the solder material 402. The low potential side conductor 201L is electrically connected with the low potential side terminal 102 shown in FIG. 4 via a solder material.

As shown in FIG. 5, the high potential side electrode 304 is electrically connected with the high potential side conductor 205L mounted on the insulation layer 401. The high potential side conductor 205L is electrically connected with a high potential side terminal 101 via a solder material.

A solder bonding conductor pattern 404 is mounted on the insulation layer 401. A first metal portion 106 is connected with the solder bonding conductor pattern 404 via the solder material 402. For the first metal portion 106, for example, aluminum or copper is used.

The first metal portion 106 has a recess 406 formed in a part facing the low potential side conductor 201L across the negative electrode sense wiring 202L. The positive electrode sense wiring 203L is disposed closer to the power semiconductor element 204L than the recess 406.

The depth of the recess 406 is formed such that the distance between the bottom of the recess 406 and the negative electrode sense wiring 202L is greater than the distance between the negative electrode sense wiring 202L and the low potential side conductor 201. Thereby, magnetic coupling between the low potential side conductor 201L and the sense wiring 202L is facilitated.

In a case where the solder bonding conductor pattern 404 extends to the lower portion of the negative electrode sense wiring 202L, the magnetic coupling between the negative electrode sense wiring 202L and the low potential side conductor 201 is weakened.

It is desirable that the recess 406 is configured such that the solder bonding conductor pattern 404 and the solder material 402, which are conductors, do not overlap each other when viewed from the array direction of the negative electrode sense wiring 202L and the recess 406. Thus, the negative electrode sense wiring 202L and the low potential side conductor 201L can be strongly magnetically coupled.

As shown in FIG. 6, the positive electrode sense wiring 203L is connected with a gate resistance 502L. The gate resistance 502 and the negative electrode sense wiring 202L are connected to a signal source 501L.

The high potential side terminal 101 is connected to a smoothing capacitor 504 and a positive electrode side of a direct-current voltage source 505. The low potential side terminal 102 is connected to the smoothing capacitor 504 and a negative electrode side of the direct-current voltage source 505. A load is connected to the alternate-current output terminal 103.

Figure 7:
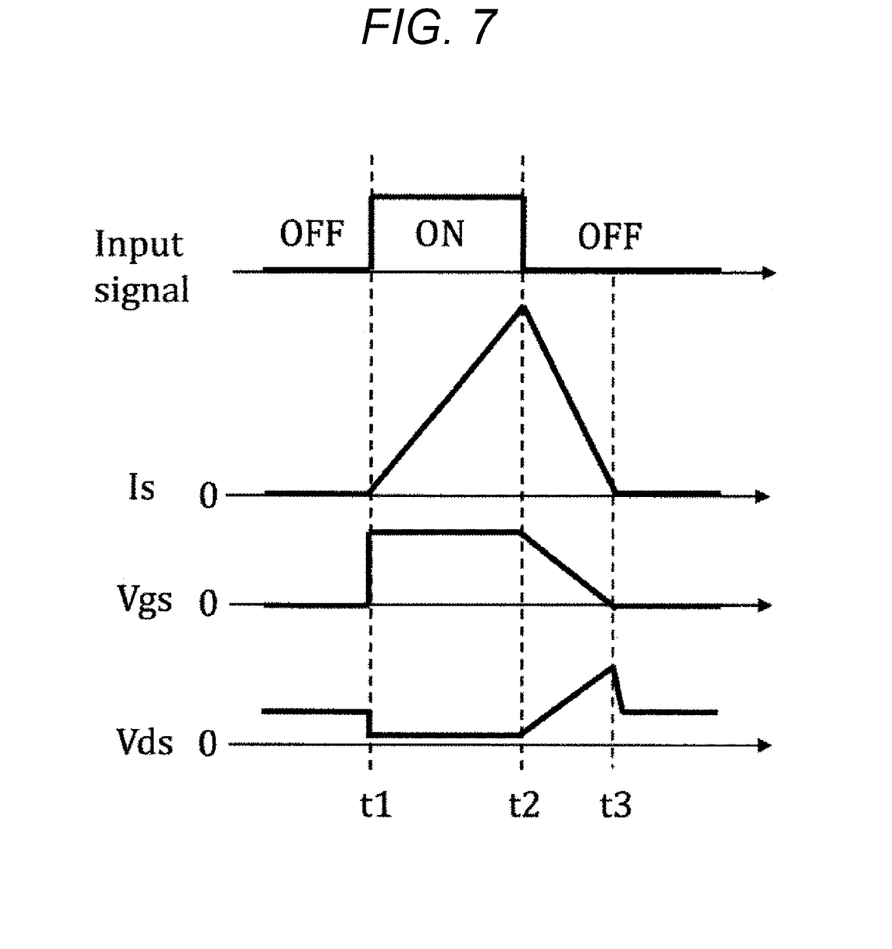
FIG. 7 is an operation waveform on a lower arm side of the inverter circuit when short-circuit protection of the inverter circuit is activated.

FIG. 7 is an operation waveform on a lower arm side of the inverter circuit when short-circuit protection of the inverter circuit is activated. FIG. 7 shows a case where a MOSFET is used as the power semiconductor element 204L. The same waveform is obtained in the case of the IGBT and in the case of the upper arm.

When an upper/lower arm short circuit occurs due to a malfunction or failure at t1, a current flows from the smoothing capacitor 504 shown in FIG. 6 and a source current Is rises sharply. This is called short-circuit current.

When a short-circuit current is detected at t2, a signal output from the signal source 501L of FIG. 6 is turned off.

Depending on di/dt at the fall of the source current Is from t2 to t3 after the signal output from the signal source 501L is turned off, a voltage is induced in the negative electrode sense wiring 202L. The induced voltage slows down the fall of a gate-source voltage Vgs and suppresses a sharp decrease in the short-circuit current. The short-circuit current decreasing slowly suppresses a surge voltage Vds generated between the drain and the source, and can suppress deterioration of the semiconductor element due to the surge voltage.

Figure 8:
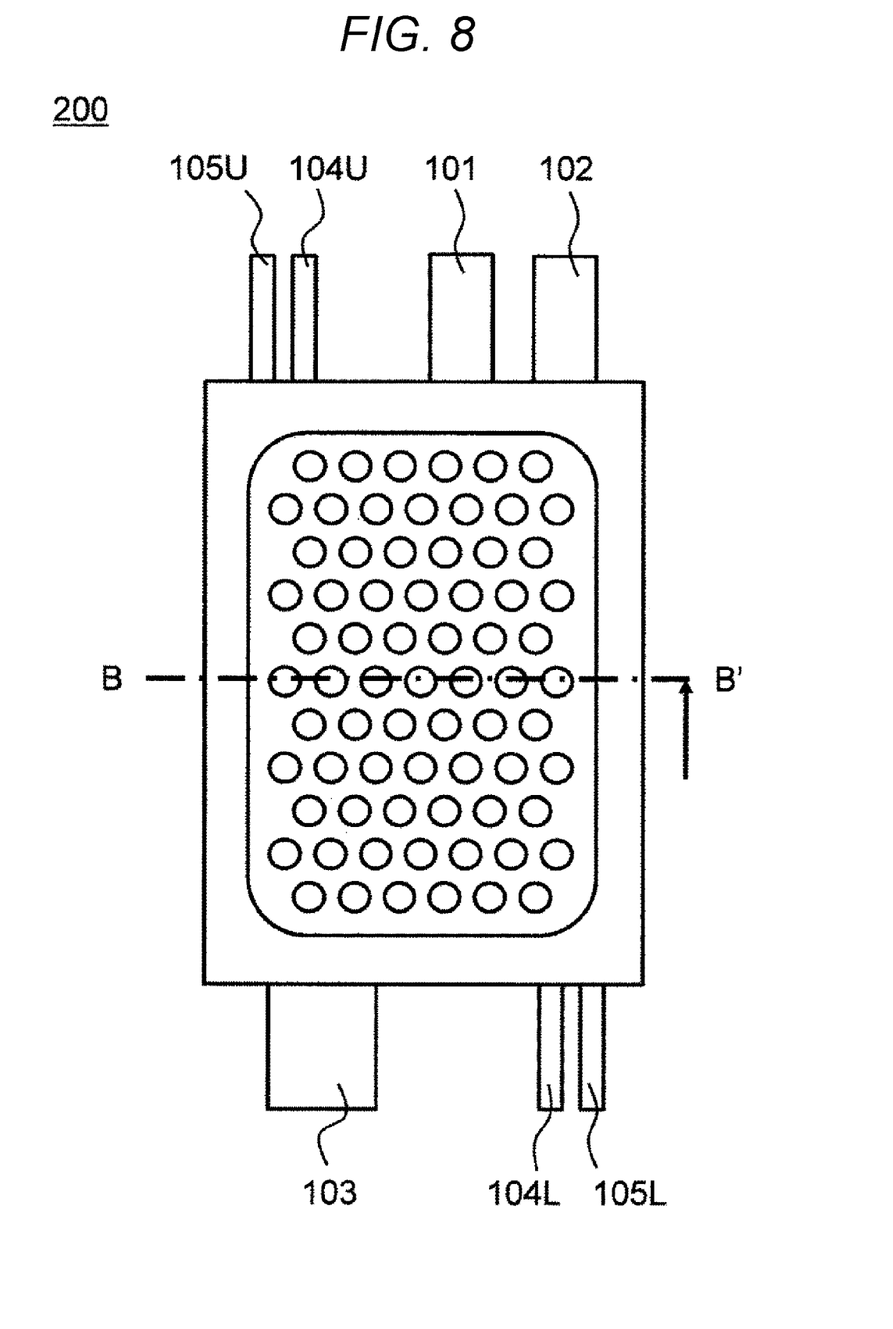
FIG. 8 is an external front view showing a power semiconductor apparatus 200 according to another embodiment.
Figure 9:
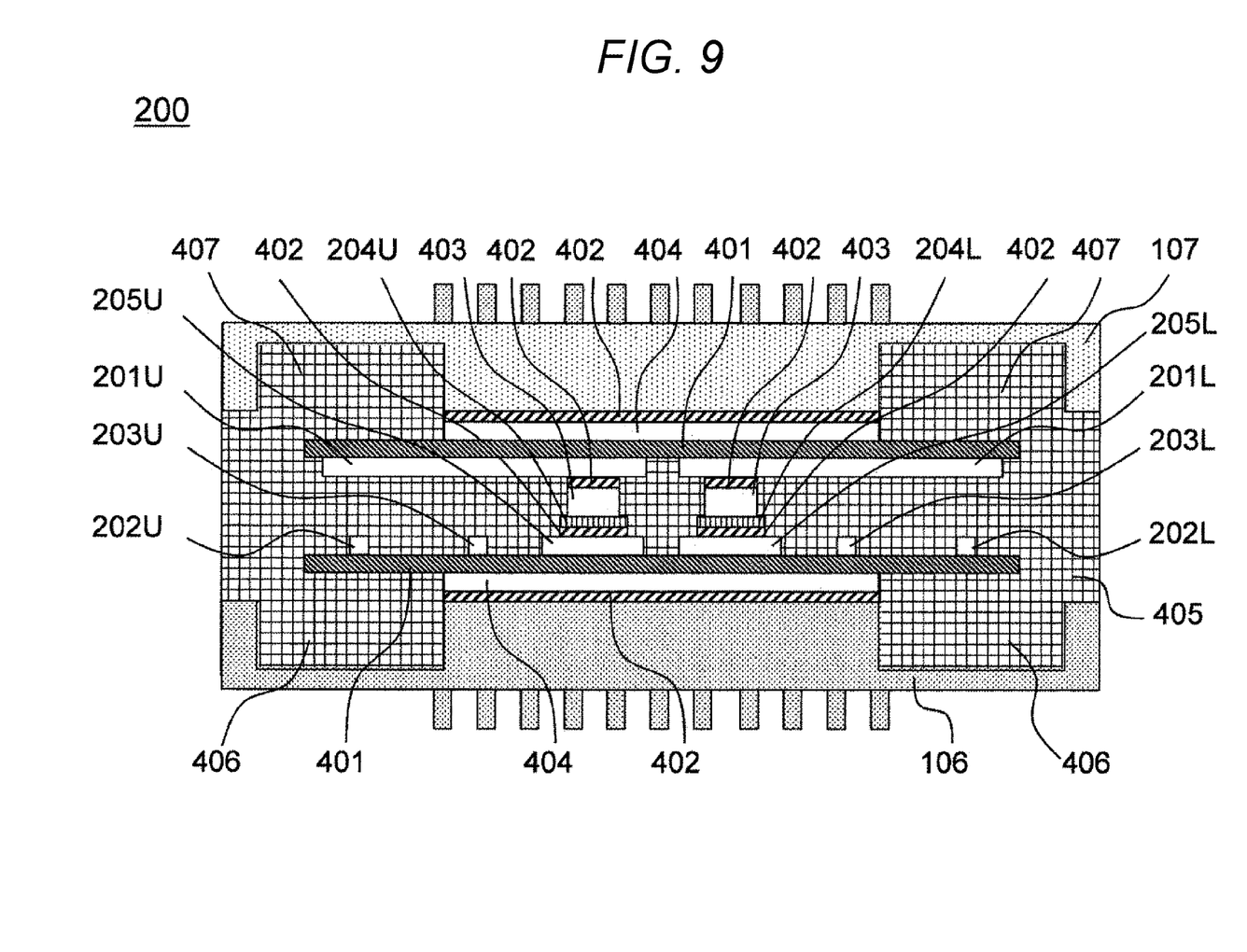
FIG. 9 is a cross-sectional view of the power semiconductor apparatus 200 shown in FIG. 8 when a cross section along the alternate long and short dash line is viewed from the arrow direction.

FIG. 8 is an external front view showing the power semiconductor apparatus 200 according to another embodiment. FIG. 9 is a cross-sectional view of the power semiconductor apparatus 200 shown in FIG. 8 when a cross section along the alternate long and short dash line is viewed from the arrow direction. In the embodiment shown in FIGS. 8 and 9, the components given the same reference numerals as the components described in FIGS. 1 to 7 have the same the functions as those described in FIGS. 1 to 7.

Similarly to the structure shown in FIG. 5, the first metal portion 106 has the recess 406 formed in a part facing the low potential side conductor 201 across the negative electrode sense wiring 202L and the negative electrode sense wiring 202U.

In the present embodiment, a second metal portion 107 is disposed at a position facing the first metal portion 106 across the power semiconductor elements 204U and 204L.

The second metal portion 107 is connected with the solder bonding conductor pattern 404 via the solder material 402. For the second metal portion 107, for example, aluminum or copper is used.

The second metal portion 107 has a recess 407 formed in a part facing the negative electrode sense wirings 202L and 202U across the low potential side conductors 201L and 201U. Here, the positive electrode sense wirings 203L and 203U need to be disposed inside relative to the recess 407.

The depth of the recess 407 is formed such that the distance between the bottom of the recess 407 and the low potential side conductor 201L or 201U is greater than the distance between the negative electrode sense wiring 202L or 202U and the low potential side conductor 201L or 201U. The recess 407 magnetically couples the negative electrode sense wiring 202 and the low potential side conductor 201.

As shown in FIG. 6, the positive electrode sense wirings 203U and 203L are electrically connected with a gate resistance 502U, and the gate resistance 502U and the negative electrode sense wires 202U and 203L are connected to a signal source 501U. The recesses 406 and 407 form a magnetic coupling structure in the low potential side conductor 201 and the sense wiring 202.

According to the present embodiment, in addition to the effects same as those of the embodiment shown in FIGS. 1 to 7, it is possible to further improve the heat dissipation properties and suppress an overvoltage at the time of occurrence of an overcurrent.

Further, the width of the recess 406 of the first metal portion 106 or the width of the recess 407 of the second metal portion 107 as shown in FIGS. 1 to 9 is formed so as to be greater than the width of the sense wiring 202. Thereby, the effect of suppressing the overvoltage at the time of occurrence of the overcurrent can be further enhanced.

REFERENCE SIGNS LIST 100 power semiconductor apparatus
101 high potential side terminal
102 low potential side terminal
103 alternate-current output terminal
104L positive electrode sense terminal
104U positive electrode sense terminal
105L negative electrode sense terminal
105U negative electrode sense terminal
106 first metal portion
107 second metal portion
200 power semiconductor apparatus
201L low potential side conductor
201U low potential side conductor
202L negative electrode sense wiring
202U negative electrode sense wiring
203L positive electrode sense wiring
203U positive electrode sense wiring
204L power semiconductor element on the lower arm side
204U power semiconductor element on the upper arm side
205L high potential side conductor
205U high potential side conductor
206 intermediate electrode
207 intermediate electrode
301 positive electrode sense electrode
302 negative electrode sense electrode
303 low potential side electrode
304 high potential side electrode
305 wire bonding
306 wire bonding
401 insulation layer
402 solder material
403 spacer
404 solder bonding conductor pattern
405 molding material
406 recess
407 recess
501L signal source
502L gate resistance
504 smoothing capacitor
505 direct-current voltage source

The invention claimed is:

1. A power semiconductor apparatus, comprising:
a power semiconductor element having a low potential side electrode, a high potential side electrode, and a sense electrode;
a high potential side conductor electrically connected with the high potential side electrode;
a low potential side conductor electrically connected with the low potential side electrode;
a sense wiring electrically connected with the sense electrode; and
a first metal portion facing the low potential side conductor or the low potential side conductor across the sense wiring,
wherein when viewed from a front view of the sense wiring and the first metal portion,
the sense wiring has a facing portion facing the high potential side conductor or the low potential side conductor,
the first metal portion forms a first recess in a part overlapping the facing portion, and
a depth of the first recess is formed such that a distance between a bottom of the fir recess and the sense wiring is larger than a distance between the sense wiring and the high potential side conductor or the low potential side conductor.

2. The power semiconductor apparatus according to claim 1,
wherein a width of the first recess is formed so as to be greater than a width of the sense wiring.

3. The power semiconductor apparatus according to claim 1, comprising:
a second metal portion facing the first metal portion across the sense wiring and the low potential side electrode.

4. The power semiconductor apparatus according to claim 3,
wherein the second metal portion forms a second recess in a part of the sense wiring that overlaps the facing portion, and
a depth of the second recess is formed such that a distance between a bottom surface of the second recess and the sense wiring is greater than a distance between the sense wiring and the low potential side conductor.

5. The power semiconductor apparatus according to claim 4, wherein a width of the second recess is formed so as to be greater than a width of the sense wiring.

6. The power semiconductor apparatus according to claim 1,
wherein the sense wiring includes a negative electrode sense wiring, and
comprises a positive electrode sense wiring different from the negative electrode sense wiring, and
when viewed from the front view of the sense wiring and the first metal portion,
the negative electrode sense wiring is provided so as to overlap the first recess or a second recess, and
the positive electrode sense wiring is provided so as not to overlap the first recess or the second recess.

* * * * *